(12) United States Patent
Egashira et al.

(10) Patent No.: US 11,360,401 B2
(45) Date of Patent: Jun. 14, 2022

(54) ALIGNMENT APPARATUS, ALIGNMENT METHOD, LITHOGRAPHY APPARATUS, AND METHOD OF MANUFACTURING ARTICLE

(71) Applicant: CANON KABUSHIKI KAISHA, Tokyo (JP)

(72) Inventors: Shinichi Egashira, Utsunomiya (JP); Genki Murayama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 48 days.

(21) Appl. No.: 16/867,776

(22) Filed: May 6, 2020

(65) Prior Publication Data

US 2020/0387075 A1 Dec. 10, 2020

(30) Foreign Application Priority Data

Jun. 7, 2019 (JP) .............................. JP2019-106854

(51) Int. Cl.
*G03F 9/00* (2006.01)
*G03F 7/20* (2006.01)

(52) U.S. Cl.
CPC ........ *G03F 9/7011* (2013.01); *G03F 7/70258* (2013.01); *G03F 9/7026* (2013.01); *G03F 9/7092* (2013.01)

(58) Field of Classification Search
CPC ..... G03F 9/7026; G03F 9/7023; G03F 9/7034
See application file for complete search history.

(56) References Cited

U.S. PATENT DOCUMENTS

| 6,522,776 | B1 | 2/2003 | Ehrichs | |
| 7,466,414 | B2 | 12/2008 | Tanaka | |
| 2007/0253616 | A1 | 11/2007 | Suto | |
| 2008/0142681 | A1* | 6/2008 | Takizawa | G02B 7/08 |
| | | | | 250/201.3 |
| 2013/0234019 | A1 | 9/2013 | Miyamoto | |

FOREIGN PATENT DOCUMENTS

JP 2003338455 A 11/2003
JP 2006216796 A 8/2006

OTHER PUBLICATIONS

Extended European Search Report issued in European Appln. No. 20174649.2 dated Nov. 12, 2020.

* cited by examiner

*Primary Examiner* — Michelle M Iacoletti
(74) *Attorney, Agent, or Firm* — Rossi, Kimms & McDowell LLP

(57) ABSTRACT

The alignment apparatus performs alignment of an object in a first direction along a surface of the object, based on a position of a predetermined target formed on the surface, and includes a holding unit that holds the object to be moved, an acquisition unit that acquires an image of the predetermined target formed on the surface of the object held by the holding unit, and a controller that drives the holding unit to realize a relative distance between the object and the acquisition unit in a second direction perpendicular to the surface of the object, a relative tilt between the object and the acquisition unit, or the distance and the tilt, the distance and the tilt being determined based on a correlation degree between the image acquired by the acquisition unit and a template, and detects a position of the predetermined target in the first direction based on the correlation degree.

14 Claims, 11 Drawing Sheets

ALIGNMENT APPARATUS, ALIGNMENT METHOD, LITHOGRAPHY APPARATUS, AND METHOD OF MANUFACTURING ARTICLE

BACKGROUND OF THE INVENTION

Field of the Invention

The present invention relates to an alignment apparatus, an alignment method, a lithography apparatus, and a method of manufacturing an article.

Description of the Related Art

In an exposure apparatus for manufacturing a semiconductor device, due to circuits becoming smaller and more dense, it is necessary to align a reticle on which a circuit pattern is formed with a substrate on which the pattern is projected with high accuracy.

As a relative alignment technique between the reticle and the substrate, there is a method of executing two types of alignment which are pre-alignment and fine alignment using an alignment mark provided on the substrate. The role of the pre-alignment is to detect the amount of shift that occurs when the substrate is sent from a substrate transfer device onto a substrate stage, and to roughly align a position of the substrate so that the fine alignment can be processed properly. In addition, the role of the fine alignment is to accurately measure a position of the substrate placed on the substrate stage, and to precisely align the substrate so that an alignment error between the substrate and the reticle is within an allowable range.

As described above, in the pre-alignment, it is necessary to detect the shift that occurs when the substrate is sent from the substrate transfer device onto the substrate stage. Therefore, the size of the alignment mark is within a wide detection range. As a method of detecting an alignment mark within such a wide detection range and calculating X and Y coordinates in a plane parallel to a surface of the substrate, pattern matching processing is known.

This type of pattern matching processing is roughly classified into two types. One is a method of binarizing an image acquired by imaging an alignment mark by a camera having a storage-type photoelectric conversion element, performing matching with a template held in advance, and setting a position having the highest correlation as a mark position. The other is a method of performing a correlation operation between a gradation image as it is and a template having gradation information. For the latter, a normalized cross-correlation method and the like are known.

Japanese Patent Laid-Open No. 2003-338455 proposes a method of automatically generating a template by extracting the pattern from the captured image and holding the extracted pattern in the pattern matching processing as described above. In this method, in the pattern matching processing, if the value of the maximum correlation degree between the template and the mark is lower than a determination threshold, the shape of the template is deformed and the template is optimized to improve the detection accuracy of the mark.

However, if a template automatically generated from a target such as the pattern or a three-dimensional shape formed on the substrate in a certain process is used for pattern matching of another substrate in the same process, a correlation degree can be reduced due to a variation in shape of the target formed on each substrate. This may reduce the position measurement accuracy.

SUMMARY OF THE INVENTION

Thus, the present invention provides, for example, an alignment apparatus that is advantageous in terms of alignment accuracy.

In order to solve the above problem, according to the present invention, there is provided an alignment apparatus that performs alignment of an object in a first direction along a surface of the object, based on a position of a predetermined target formed on the surface, the apparatus including a holding unit that holds the object to be moved, an acquisition unit that acquires an image of the predetermined target formed on the surface of the object held by the holding unit, and a controller that drives the holding unit to realize a relative distance between the object and the acquisition unit in a second direction perpendicular to the surface of the object, a relative tilt between the object and the acquisition unit, or the distance and the tilt, the distance and the tilt being determined based on a correlation degree between the image acquired by the acquisition unit and a template, and detects a position of the predetermined target in the first direction based on the correlation degree.

Further features of the present invention will become apparent from the following description of exemplary embodiments with reference to the attached drawings.

DESCRIPTION OF THE EMBODIMENTS

Figure 1:
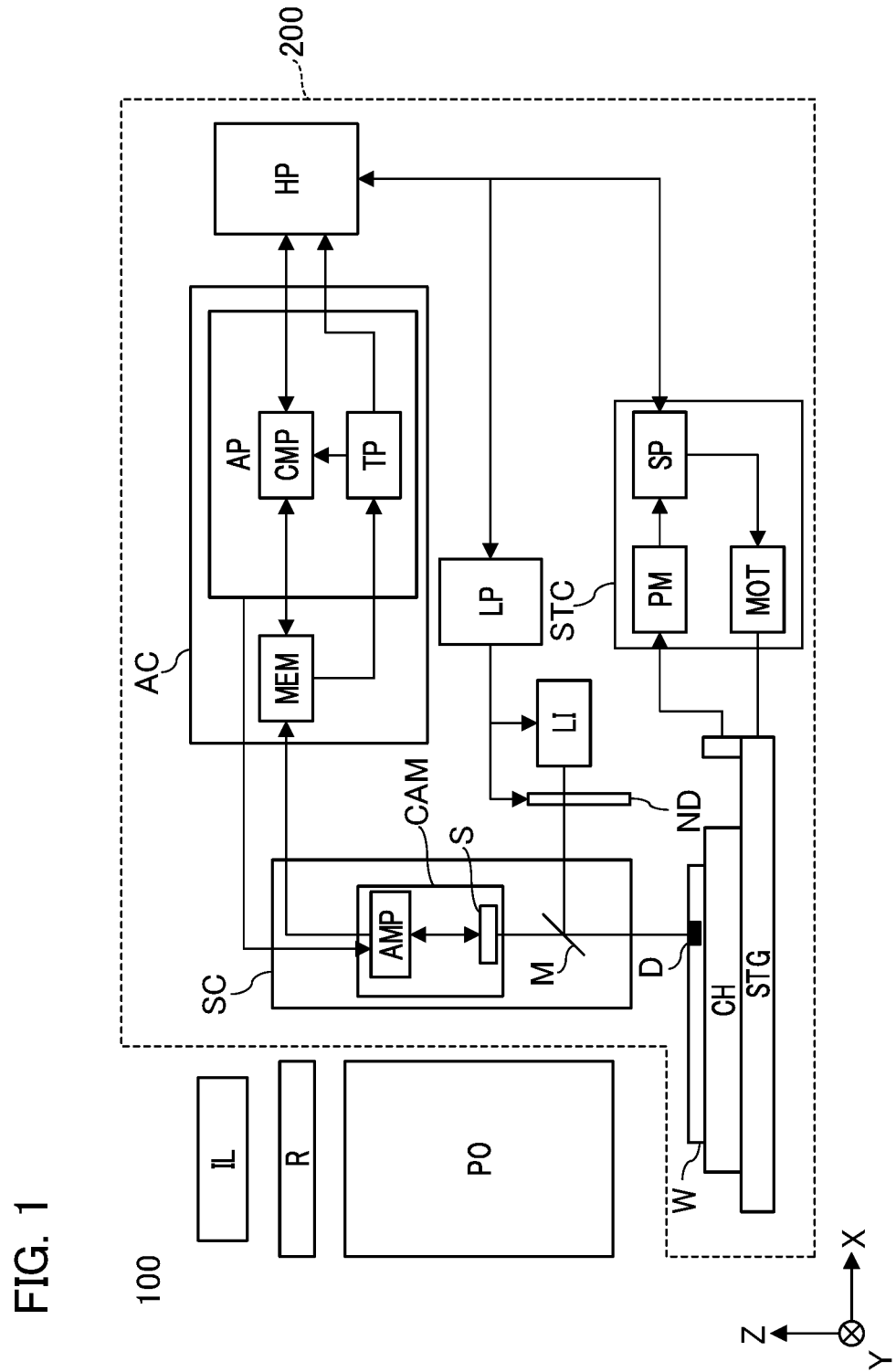
FIG. 1 is a schematic diagram that illustrates a configuration of an exposure apparatus to which an alignment apparatus according to a first embodiment is applied.

Hereinafter, preferred embodiments of the present invention will be described in detail with reference to the accompanying drawings.

First Embodiment

A position detecting apparatus according to a first embodiment of the present invention will be described. Note that, in each figure, identical members are assigned to the same reference numerals and overlapping description is omitted.

FIG. 1 is a schematic diagram that illustrates a configuration of an exposure apparatus 100 to which an alignment apparatus 200 according to the first embodiment is applied. The exposure apparatus 100 is used for a lithography process that is a manufacturing process of a semiconductor device or a liquid crystal display element, and is one of lithography apparatuses that form a pattern on a substrate using an original plate. In the description of the following embodiments, the alignment apparatus 200 is applied to an exposure apparatus, but the present invention is not limited to this. For example, the present invention can also be applied to a lithography apparatus such as an imprint apparatus that forms a pattern of an imprint material on a substrate using a mold or a drawing apparatus that irradiates a substrate with a charged particle beam to form a pattern on the substrate. Further, in the following, a direction perpendicular to a surface of the substrate held on a substrate stage STG described below is defined as a Z direction (second direction), and two directions orthogonal to each other as a direction (first direction) along the surface of the substrate are defined as an X direction and a Y direction. In addition, rotation around an X axis, rotation around a Y axis, and rotation around a Z axis are referred to as θX, θY, and θZ, respectively.

The exposure apparatus 100 of the present embodiment includes an illumination system IL, a projection optical system PO, and the alignment apparatus 200. The exposure apparatus 100 is an apparatus that aligns a reticle R, which is an original plate, with a substrate W, irradiates the reticle R with exposure light by the illumination system IL, and transfers a pattern of the reticle R onto the substrate W via the projection optical system PO.

The illumination system IL includes a light source, and illuminates the reticle R with light from the light source in an arc shape, for example. The projection optical system PO is, for example, an optical system of a mirror projection type including a plurality of mirrors. The projection optical system PO has a predetermined projection magnification (for example, 1 or ½) and projects the pattern formed on the reticle R onto the substrate W.

The alignment apparatus 200 includes a substrate stage STG, an alignment scope SC, a measurement unit AC, and a host controller HP. The alignment apparatus 200 performs alignment of an object such as the substrate W.

A chuck CH that adsorbs (fixes) the substrate is disposed on the substrate stage STG, and the substrate stage STG is a holding unit that holds the substrate W via the chuck CH to be moved. The substrate stage STG aligns the substrate W with the reticle R by moving the substrate W in the X-axis direction and the Y-axis direction. The substrate stage STG is also movable in the Z-axis direction for focus adjustment of exposure light. Further, the substrate stage STG may have a function of adjusting the position of the substrate W in the θZ (more preferably, θX, θY, and θZ) direction, and a tilt function for correcting a tilt of the substrate W.

The alignment scope SC is an imaging means (acquisition unit) that acquires an image of a device D by observing the device D (detection target) such as an alignment mark or a three-dimensional shape formed on the surface of the substrate W. The alignment scope SC performs alignment of the substrate W with the device D as a target. The amount of light emitted from a light source LI is adjusted via an ND filter ND, and the light is guided to a half mirror M by a fiber or a dedicated optical system and irradiated to a device D via a projection optical system or the like. The light source LI or the ND filter ND is controlled by a light amount adjusting means LP. The image of the device D passes through the half mirror M and is projected onto a photosensor S in a mark imaging camera CAM.

The image of the device D received by the photosensor S is photoelectrically converted. At this time, the time for accumulating light is transmitted from the host controller HP to a measurement processing unit AP in the measurement unit AC serving as a means for calculating a position of the device D and the amount of light, and is controlled by a sensor controller AMP. Further, the timing of accumulating light is transmitted from a stage processing unit SP of a stage controller STC serving as a stage control means to the measurement processing unit AP and is referred to by the sensor controller AMP. The stage processing unit SP drives the substrate stage STG with a motor MOT, and measures the position with an interferometer PM. A signal photoelectrically converted by the photosensor S is A/D-converted by the sensor controller AMP, and is output to the measurement unit AC as an image that is digital signal information.

The measurement unit AC includes a memory MEM and the measurement processing unit AP. The image of the device D to be measured, which is output to the measurement unit AC, is stored in the memory MEM. The measurement processing unit AP detects the position of the device D from the image stored in the memory MEM. In order to use pattern matching as a method of detecting the position of the device D, first, a correlation degree between the image stored in the memory MEM and a template TP stored in the measurement processing unit AP is calculated by a calculator CMP and acquired. Thereafter, the position of the device D in the first direction is detected from the image based on the calculation result. The detected position of the device D is transmitted to the host controller HP. The host controller HP aligns the substrate stage STG via the stage controller STC based on the detected position of the device D.

Figure 2A:
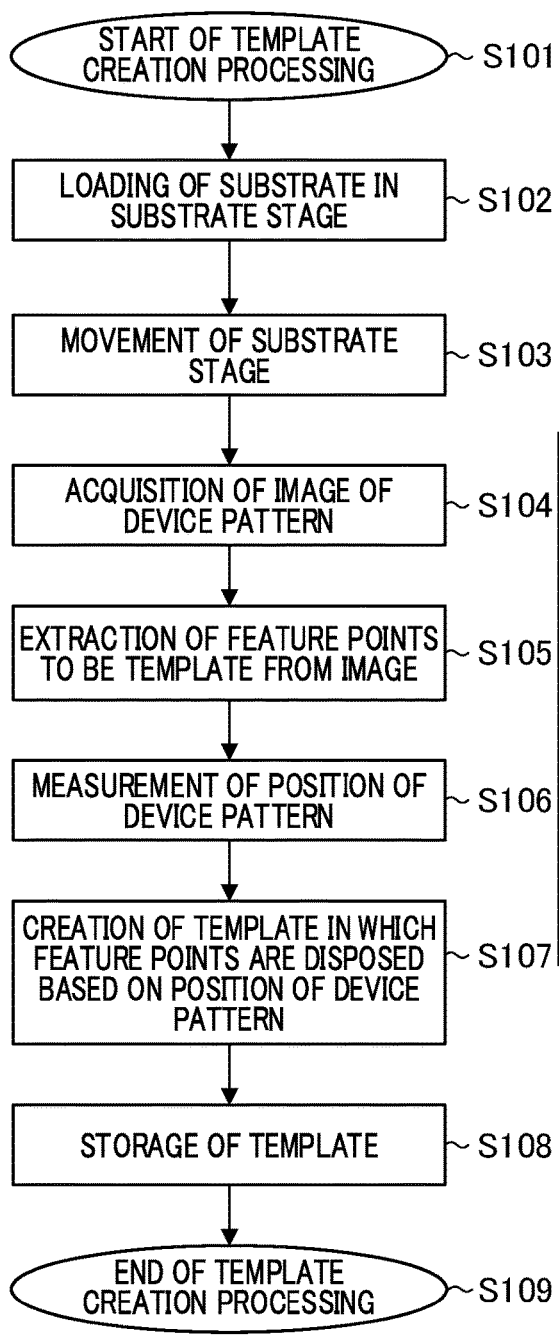
FIGS. 2A and 2B are flowcharts that illustrate alignment processing according to the first embodiment.
Figure 2B:
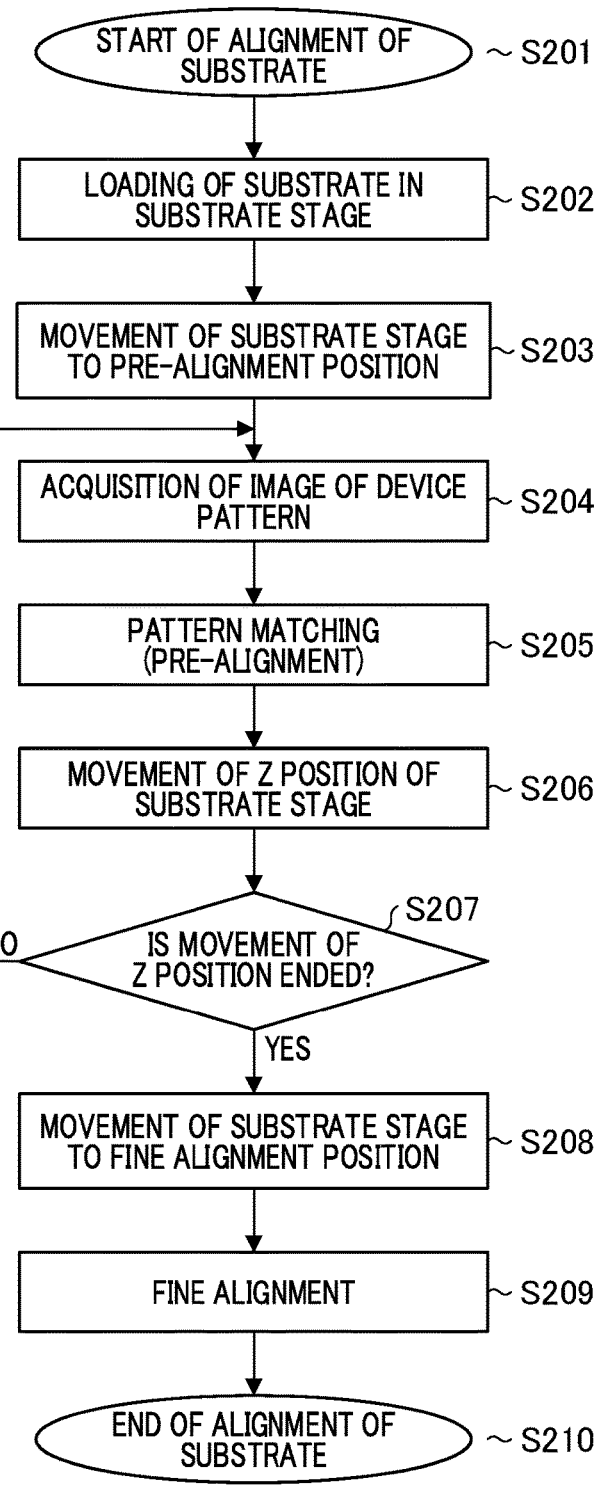

The flow of the present embodiment will be described with reference to FIGS. 2A and 2B. FIGS. 2A and 2B are flowcharts that illustrate alignment processing according to the first embodiment. FIG. 2A is a flowchart that illustrates processing in which a template is created from a device shape drawn on a substrate in an actual process in the present embodiment. Each act (step) illustrated in this flowchart can be executed by control of each unit by the host controller HP.

First, when the template creation processing is started (S101), the substrate W is loaded onto the substrate stage STG in the exposure apparatus 100 by a loading device (not shown) (S102). The substrate stage STG is moved by the control of the stage controller STC so that a device pattern of the loaded substrate W which is to be a template is within a photographing field of view of the alignment scope SC (S103). Here, as an example, the device pattern is a through-hole for connection between substrates, formed in the substrate W, but is not limited to this. The device pattern is, for example, a three-dimensional structure including at least one of the through-hole, an alignment mark having a three-dimensional shape, a convex portion protruding from the substrate surface, and a concave portion (groove, recess) not penetrating the substrate. Here, the device pattern is a detection target.

Figure 3:
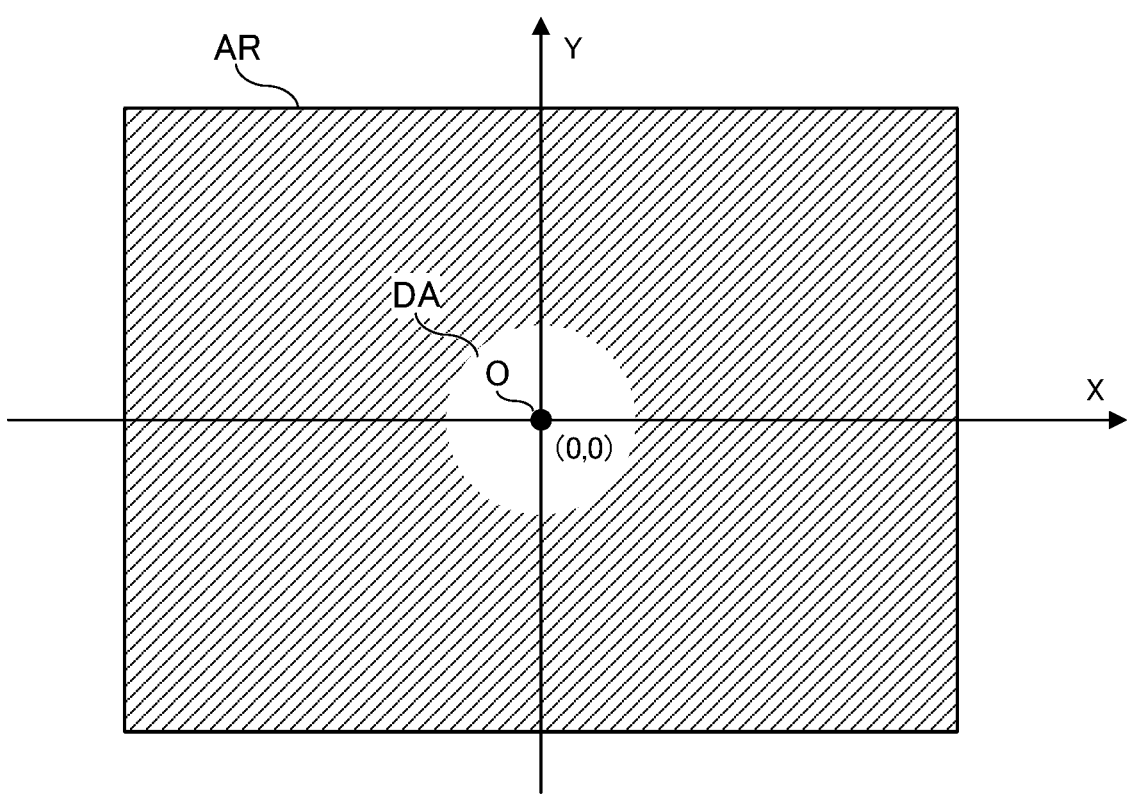
FIG. 3 is a schematic diagram that illustrates an example of an image of a device pattern.

Next, a reference image is acquired by photographing the device pattern of the substrate W to be used as the template by the alignment scope SC (S104). It is assumed that photographing conditions of the device pattern, for example, the amount of light to be irradiated to the device pattern, a focus position, and the like, have been determined by advance measurement. The device pattern to be photographed will be described with reference to FIG. 3. FIG. 3 is a schematic diagram that illustrates an example of the image of the device pattern. The center O of the image in an XY coordinate system is set as (0,0). A device pattern DA to be aligned is in a detection range AR in the image. Here, the device pattern DA is, for example, the through-hole for connection between substrates, and thus is acquired as a circular shape in the image.

Thereafter, returning to FIG. 2A, feature points that can be a pattern of the template are extracted from the image of the acquired device pattern by the measurement processing unit AP (S105). Specifically, an image in which only an edge portion of the device pattern is emphasized is generated by differentiating the image acquired by photographing the device pattern DA in the X direction and the Y direction. For the edge portion, the feature points are extracted based on a signal intensity or an interval of points to be registered as a template. In the present embodiment, a method of extracting the feature points is not limited to the above, and any other method may be used as long as the feature points are indexes indicating a feature of the device. Thereafter, in order to determine the position of the template, the position of the device pattern is measured (S106). In order to set the center of the template as the center of the device pattern, the center position of the circular device pattern DA shown in FIG. 3 is measured. As an example of a method of measuring the center position, the center position is calculated in a manner of calculating the center of gravity of a circular portion by the calculator CMP.

Figure 4:
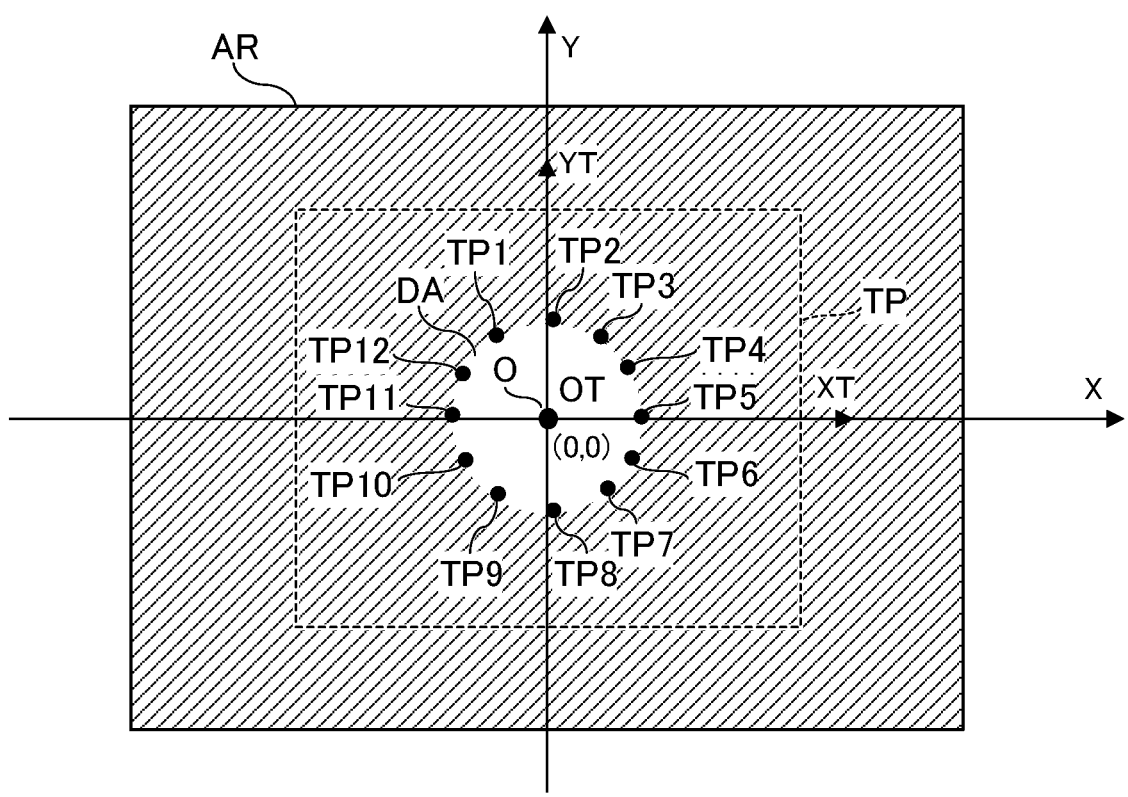
FIG. 4 is a schematic diagram that illustrates an example of a template.

Then, a template in which feature points are disposed is created based on the position of the device pattern by the measurement processing unit AP (S107). FIG. 4 shows an example of the template created based on the image of FIG. 3. FIG. 4 is a schematic diagram that illustrates the example of the template. A template TP is made by extracting multiple points for the edge such that the feature points to be extracted in S105 are TP1 to TP12 for preventing erroneous detection and by disposing the extracted TP1 to TP12 in the XY coordinate system in which the center OT of the circle acquired in S106 is set as (0, 0). Note that the number of feature points illustrated is an example, and extracting more feature points results in higher accuracy in matching described later. In the example shown in FIG. 4, the center OT of the template overlaps the center O of the image because the device pattern DA is located at the center of the image. The X axis XT of the template also overlaps the X axis of the image, and similarly the Y axis YT of the template also overlaps the Y axis of the image. When the created template TP is stored in the measurement unit AC or the host controller HP (FIG. 2A, S108), a series of processing is ended (S109).

Next, a method of measuring the substrate position using the stored template which is created in advance and is created in a process shown in the flowchart of FIG. 2A will be described with reference to FIG. 2B. FIG. 2B is a flowchart that illustrates alignment processing of the substrate position using the template.

When substrate alignment is started (S201), the substrate W is loaded onto the substrate stage STG in the exposure apparatus 100 by a loading device (not shown) (S202). The loaded substrate W, that is, the substrate W to be measured, is a substrate manufactured by the same process as the substrate in which the template has been prepared in advance. The substrate stage STG is moved to a pre-alignment position of the loaded substrate W by the control of the stage controller STC (S203). Here, the pre-alignment position is a position where a device pattern (device pattern to be measured) that is formed on the substrate W to be measured and corresponds to a device pattern for which a template has been created in advance is within the photographing field of view of the alignment scope SC.

Next, an image is acquired by photographing the device pattern of the substrate W to be measured by the alignment scope SC (S204). Then, the position of the device pattern is detected by pattern matching using the acquired image and the template created in advance (S205). Specifically, in the pattern matching, the correlation degree between the acquired image stored in the memory MEM and the template TP corresponding to the device pattern DA in each pixel within the detection range AR is calculated by the calculator CMP. From the correlation degree, a position similar to the pattern in the detection range AR is detected as a device position.

Figure 5:
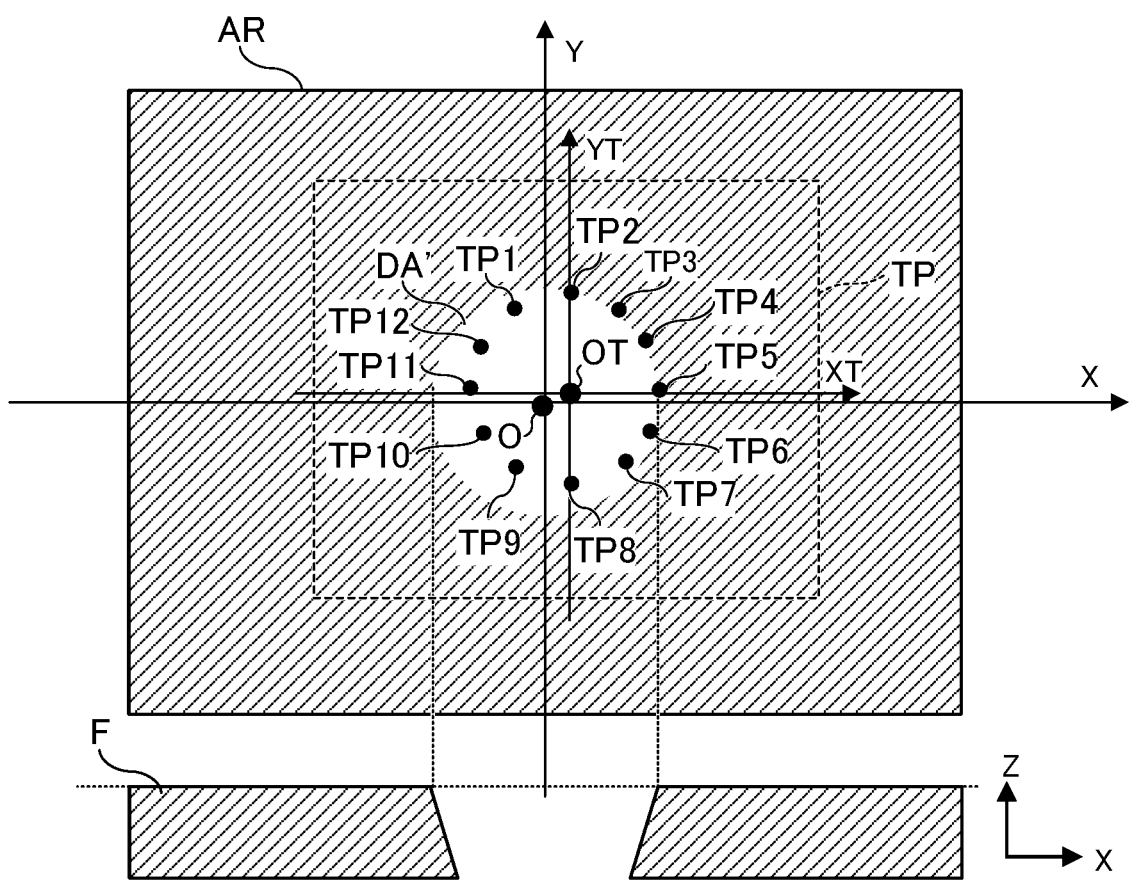
FIG. 5 is a diagram that illustrates detection of the device pattern using the template.

An example of detecting the position of the device pattern by the pattern matching using the template created in advance will be described in detail with reference to FIG. 5. FIG. 5 is a diagram that illustrates detection of the device pattern using the template. A device pattern DA' shown in FIG. 5 is a detection target formed on the substrate to be measured. The device pattern DA' is manufactured by the same process as the device pattern DA for which the template is created, but the device pattern shape between the substrates slightly varies due to the process. Therefore, when pattern matching is performed in a state where the device pattern DA of the template and the device pattern DA' to be measured are not matched in shape, a position shifted from the center of the actual device pattern DA' can be detected as the center of the device pattern DA'.

In FIG. 5, the actual center of the device pattern DA' is the center O of the image, but the center OT of the template which is detected by the pattern matching is a position shifted from O. In such a case, a situation in which processing is continued with a position different from the actual center of the device pattern DA' set as the center, or the center of the device pattern DA' cannot be detected because the correlation degree is too low may occur.

Returning to FIG. 2B, in the present embodiment, in order to detect the height position of the substrate W where the correlation degree between the device pattern DA of the template and the device pattern DA' to be measured is higher, a Z position (relative distance) of the substrate stage STG is minutely moved (S206). In other words, the relative positional relationship between the substrate W and the alignment scope SC in a direction in which the alignment scope SC is separated from the substrate W, that is, in the direction perpendicular to the surface of the substrate W, is changed by moving the substrate stage STG in the Z direction. Then, image acquisition (S204) and template matching (S205) are each repeated at different height positions. That is, after the template matching (S205) is executed, the Z position of the substrate stage STG is minutely moved by the control of the stage controller STC (S206). Thereafter, the measurement processing unit AP calculates the correlation degree for each height and determines whether to end the minute movement of the Z position (S207). Specifically, for example, the number of repetitions of S204 to S206 may be set in advance, and if S204 to S206 are repeated a predetermined number of times, it may be determined to end the minute movement of the Z position. In addition, a threshold value of the correlation degree may be set in advance, and if the correlation degree becomes equal to or less than the threshold value, it may be determined to end the minute movement of the Z position.

Alternatively, a relative distance at which the correlation degree reaches a peak may be searched for. Steps S204 to S206 are repeated until the measurement processing unit AP determines to end the minute movement of the Z position (S207, Yes). Thereby, the Z position of the substrate stage STG is determined based on the correlation degree. In other words, the host controller HP determines the relative distance between the substrate W and the alignment scope SC, that is, the Z position of the substrate stage STG, while repeatedly changing the relative distance between the substrate W and the alignment scope SC, to increase the correlation degree.

Note that the substrate stage STG may be minutely moved (S206) after determining whether to end the minute movement of the Z position (S207). If it is determined to end the calculation of the correlation degree, it is not necessary to move the substrate stage STG, and thus unnecessary movement of the substrate stage STG can be reduced.

Next, in a state where the relative positional relationship is set to a first state where the correlation degree is relatively high among the calculated correlation degrees, the host controller HP compares the correlation degrees of the acquired images. Then, the host controller HP determines a fine alignment position based on the position of the device pattern DA' which is acquired based on the image of the device pattern DA' which is acquired at the height position where the correlation degree is highest, and moves the substrate stage STG (S208) to the fine alignment position. That is, the position of the object is adjusted in the XY directions along the substrate surface to a second state where the correlation degree is relatively high. Here, the fine alignment is final alignment of the substrate before exposure, and the fine alignment position is a position of the substrate W when performing the fine alignment.

Figure 6:
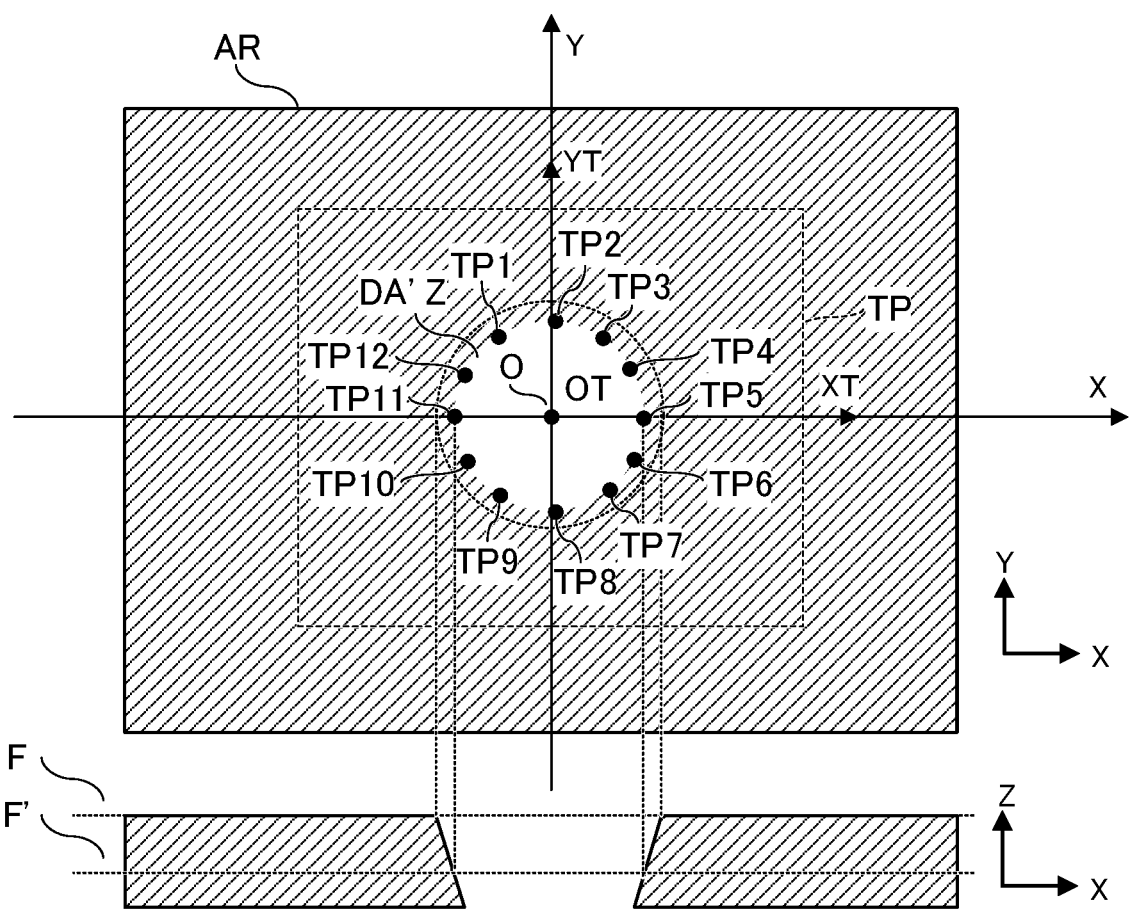
FIG. 6 is a schematic diagram that illustrates an example of an acquired image.
Figure 7:
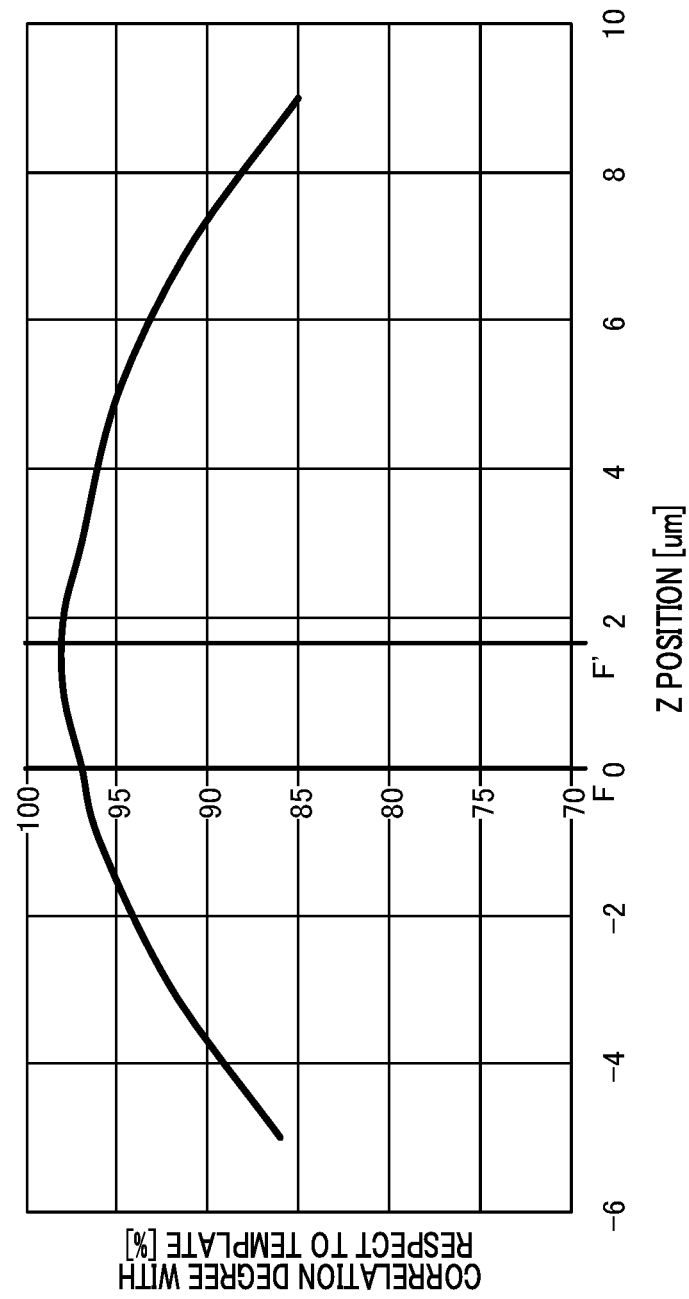
FIG. 7 is a diagram that illustrates an example of a graph in which a correlation degree at each Z position is plotted.

Processing in which a fine alignment position is determined using an image having a higher correlation degree will be described with reference to FIGS. 6 and 7. FIG. 6 is a schematic diagram that illustrates an example of the acquired image. An image which is acquired while changing the height position of the substrate W by moving the Z position of the substrate stage STG will be described with reference to FIG. 6. In FIG. 6, since the through-hole is taken as an example, the device pattern to be measured has a shape having a depth from the substrate surface, that is, a three-dimensional structure. In this example, the through-hole has a tapered shape in which a diameter decreases as the depth increases from the surface of the substrate.

The image is acquired while moving the Z position of the substrate stage STG, and thus the image is acquired not at a height F of the substrate which is determined in advance as the best focus but at a height F' which is a height position different from the height F. In the image acquired by focusing on the height F' of the substrate, the shape of the device pattern seems to be similar to the template, and thus the pattern matching results in the correlation degree higher than the image shown in FIG. 5. FIG. 6 is an image of the device pattern DA' acquired at a height F' which is a height position different from that of the template TP. This figure shows an ideal example in which the device pattern DA'Z in the image matches the feature points TP1 to TP12 of the template, and the center O of the device pattern and the center OT of the template to be detected overlap.

The correlation degree between the device pattern shape and the template for each Z position of the substrate stage STG is described with reference to FIG. 7. FIG. 7 illustrates an example of a graph in which the correlation degree at each Z position is plotted. As shown in the figure, the correlation degree differs depending on the Z position. Therefore, it is preferable to align the position of the substrate W using a measurement result obtained by performing pattern matching using the image acquired at the height F' of the substrate at which the correlation degree reaches a peak.

Returning to FIG. 2B, specifically, the movement of the substrate stage STG to the fine alignment position is performed, for example, as follows. The position of the device pattern DA' is calculated based on the image of the device pattern DA' having the highest correlation degree by the calculator CMP. The calculated position of the device pattern DA' is transmitted to the host controller HP. The host controller HP determines the fine alignment position based on the calculated position of the device pattern DA'. The host controller HP outputs the determined fine alignment position to the stage controller STC. The stage controller STC controls the substrate stage STG to the fine alignment position and moves the substrate to the fine alignment position.

Next, fine alignment is performed at the fine alignment position (S209). Note that alignment of the substrate may be ended only by the result of the pattern matching without performing the fine alignment. That is, the fine alignment position may be a final substrate position before exposure.

In the present embodiment, the measurement unit AC, the stage controller STC, and the host controller HP are provided separately, but they may be a single controller.

According to the above, even if the shape of the detection target such as the alignment mark or the three-dimensional shape formed on the substrate varies for each substrate, it is possible to perform accurate alignment.

Second Embodiment

Figure 8:
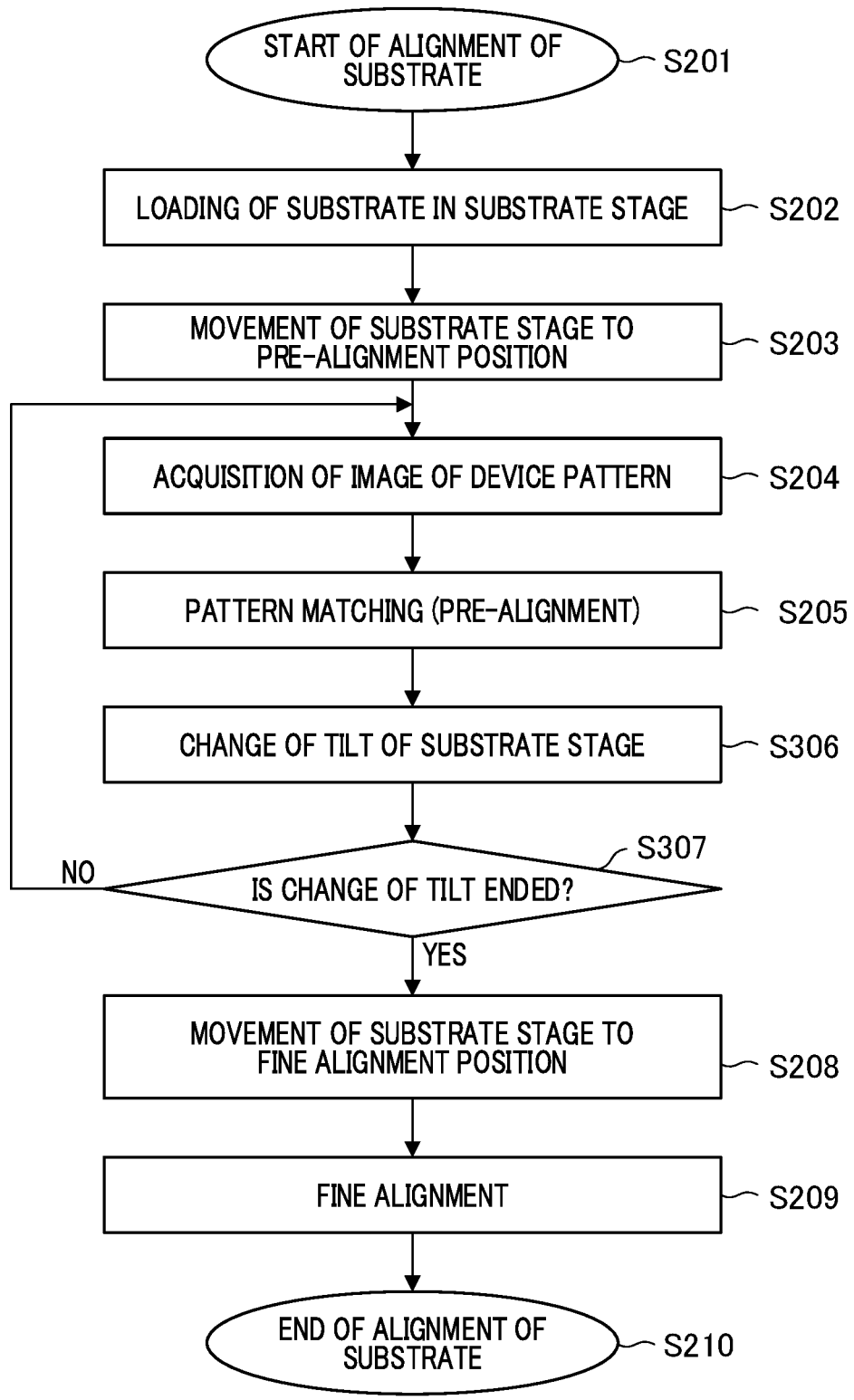
FIG. 8 is a flowchart that illustrates an example of substrate alignment processing according to a second embodiment.

In the first embodiment, in order to improve the correlation degree between the device pattern shape to be measured and the template, the relative positional relationship between the substrate W and the alignment scope SC is adjusted by changing the height position of the substrate W. In a second embodiment, the correlation degree is improved by adjusting the tilt of the substrate W. The configuration of the exposure apparatus is the same as that of FIG. 1 of the first embodiment. The processing of creating a template according to the present embodiment is the same as the flow shown in FIG. 2A of the first embodiment, but differs from the first embodiment in the flow of substrate alignment processing using a template. Therefore, the portions different from the first embodiment will be described with reference to a flowchart of FIG. 8. FIG. 8 is a flowchart that illustrates an example of substrate alignment processing using a template according to the second embodiment.

In the flow of the present embodiment, the process of S206 to S208 is different from that of FIG. 2B. S201 to S205, S209, and S210 are the same as those of FIG. 2B, and thus description thereof will be omitted. The position of the device pattern is detected by pattern matching using the acquired image and the template created in advance (S205), and then a tilt of the substrate stage STG is minutely changed by the control of the stage controller STC (S306). In other words, the relative positional relationship between the substrate W and the alignment scope SC in a direction in which the alignment scope SC is separated from the substrate W, that is, in the direction perpendicular to the surface of the substrate W, is changed by changing the tilt of the substrate stage STG. Then, image acquisition (S204) and template matching (S205) are each repeated with different tilts. That is, after the template matching (S205) is executed, the tilt of the substrate stage STG is minutely changed by the control of the stage controller STC (S306). Thereafter, the measurement processing unit AP determines whether or not to end the minute change of the tilt of the substrate stage STG (S307). Steps S204 to S306 are repeated until the measurement processing unit AP determines to end the minute change of the tilt (S307, Yes). In other words, the host controller HP determines the tilt of the substrate stage STG while repeatedly changing the tilt of the substrate stage STG to increase the correlation degree. For example, if the surface of the substrate is distorted, alignment accuracy can be further improved by adjusting the tilt of the substrate. Thereby, the relative positional relationship (including the tilt) is set to the first state where the correlation degree is relatively high. Here, the first state includes, for example, a state where the correlation degree reaches a peak if the tilt is adjusted. Then, similar to the first embodiment, in the first state, the position of the object is adjusted in the XY directions along the substrate surface to a second state where the correlation degree is relatively high.

According to the above, even if the surface of the substrate is distorted, it is possible to perform accurate alignment of the substrate.

Third Embodiment

Figure 9:
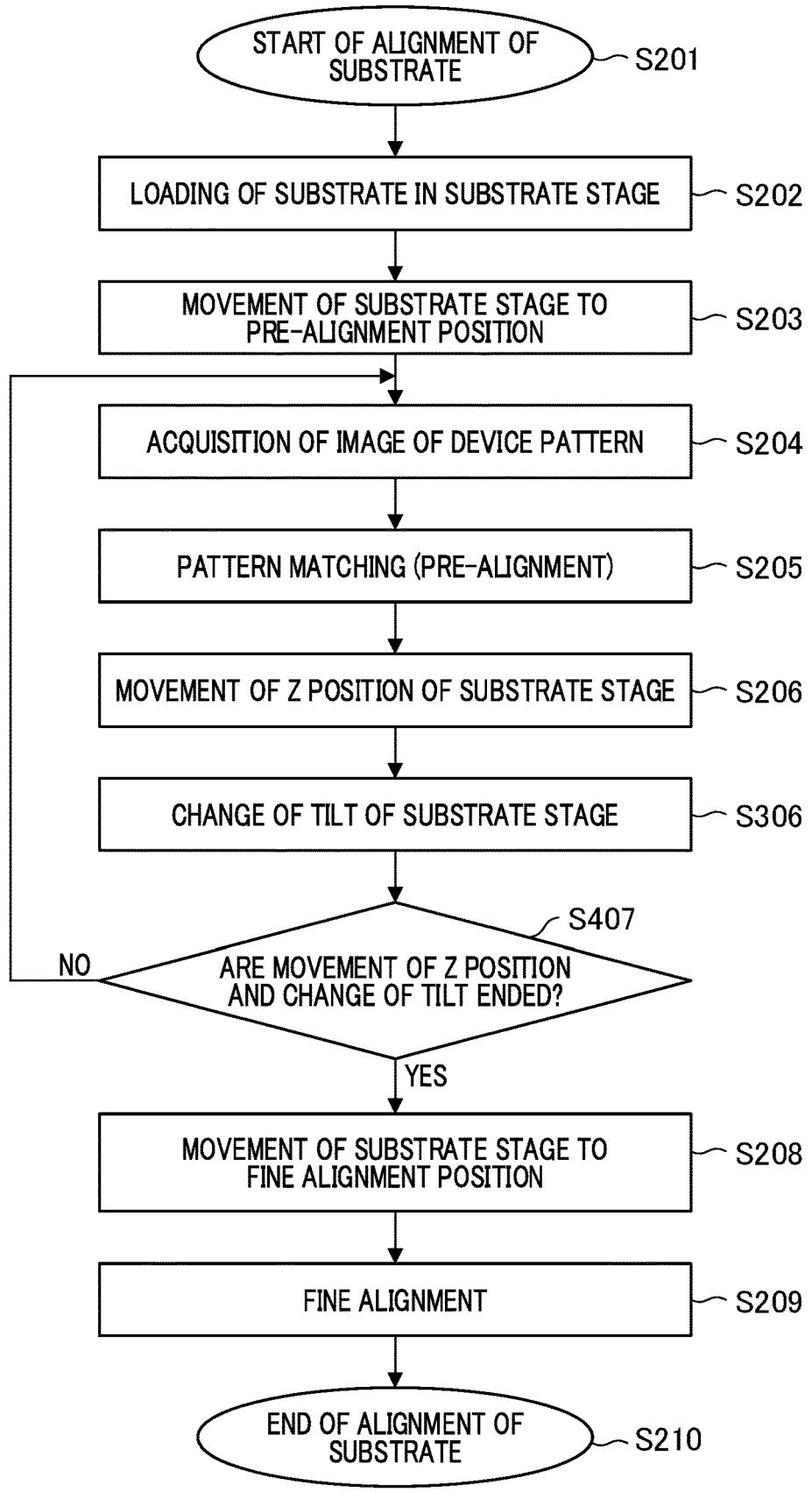
FIG. 9 is a flowchart that illustrates an example of substrate alignment processing according to a third embodiment.

A third embodiment is a combination of the first embodiment and the second embodiment, and in the present embodiment, the correlation degree between the template and the image is further improved by adjusting the Z position (relative distance) and the tilt of the substrate. The configuration of the exposure apparatus is the same as that of FIG. 1 of the first embodiment. The processing of creating a template according to the present embodiment is the same as the flow shown in FIG. 2A of the first embodiment, but differs from the first embodiment in the flow of substrate alignment processing using a template. Therefore, the portions different from the first embodiment will be described with reference to a flowchart of FIG. 9. FIG. 9 is a flowchart that illustrates an example of substrate alignment processing using a template according to the third embodiment.

In the flow of the present embodiment, S201 to S205, S209, and S210 are the same as those of FIG. 2B, and thus description thereof will be omitted. The position of the device pattern is detected by pattern matching using the acquired image and the template created in advance (S205), and then the Z position of the substrate stage STG is minutely moved by the control of the stage controller STC (S206). Thereafter, the tilt of the substrate stage STG is minutely changed by the control of the stage controller STC (S306). Thereby, the relative positional relationship between the substrate W and the alignment scope SC is changed, and the image acquisition (S204) and the template matching (S205) are each repeated at different height positions and different tilts. That is, after the template matching (S205) is executed, the Z position of the substrate stage STG is minutely moved (S206) and the tilt thereof is minutely changed (S306) by the control of the stage controller STC. Thereafter, the measurement processing unit AP determines whether or not to end the minute movement of the Z position and the minute change of the tilt of the substrate stage STG (S407). Steps S204 to S306 are repeated until the measurement processing unit AP determines to end the minute movement of the Z position and the minute change of the tilt of the substrate stage STG (S407, Yes). In other words, the host controller HP determines the relative distance, that is, the Z position of the substrate stage STG and the tilt of the substrate stage STG, while repeatedly changing the relative distance and the tilt of the substrate stage STG to increase the correlation degree. For example, if the device pattern is complicatedly deformed, such as an unexpected change in the shape of the device pattern, the measurement accuracy in a position and a posture of the substrate can be further improved by moving the substrate stage in combination with the height and the tilt.

In the flow in FIG. 9, the minute change of the tilt of the substrate stage (S306) is executed after the minute movement of the Z position of the substrate stage (S206), but S206 may be executed after S306. Further, S206 and S306 may be acted in parallel, in other words, S206 and S306 may be executed simultaneously.

According to the above, even if the shape of an alignment mark, a device, or the like formed on the substrate is complicatedly deformed, it is possible to perform accurate alignment.

Fourth Embodiment

A fourth embodiment does not execute FIG. 2A, which is the template creation processing flow performed in the above-described embodiment, and executes alignment using an externally input template such as a template created in advance with a design value of the device or in another line.

Figure 10:
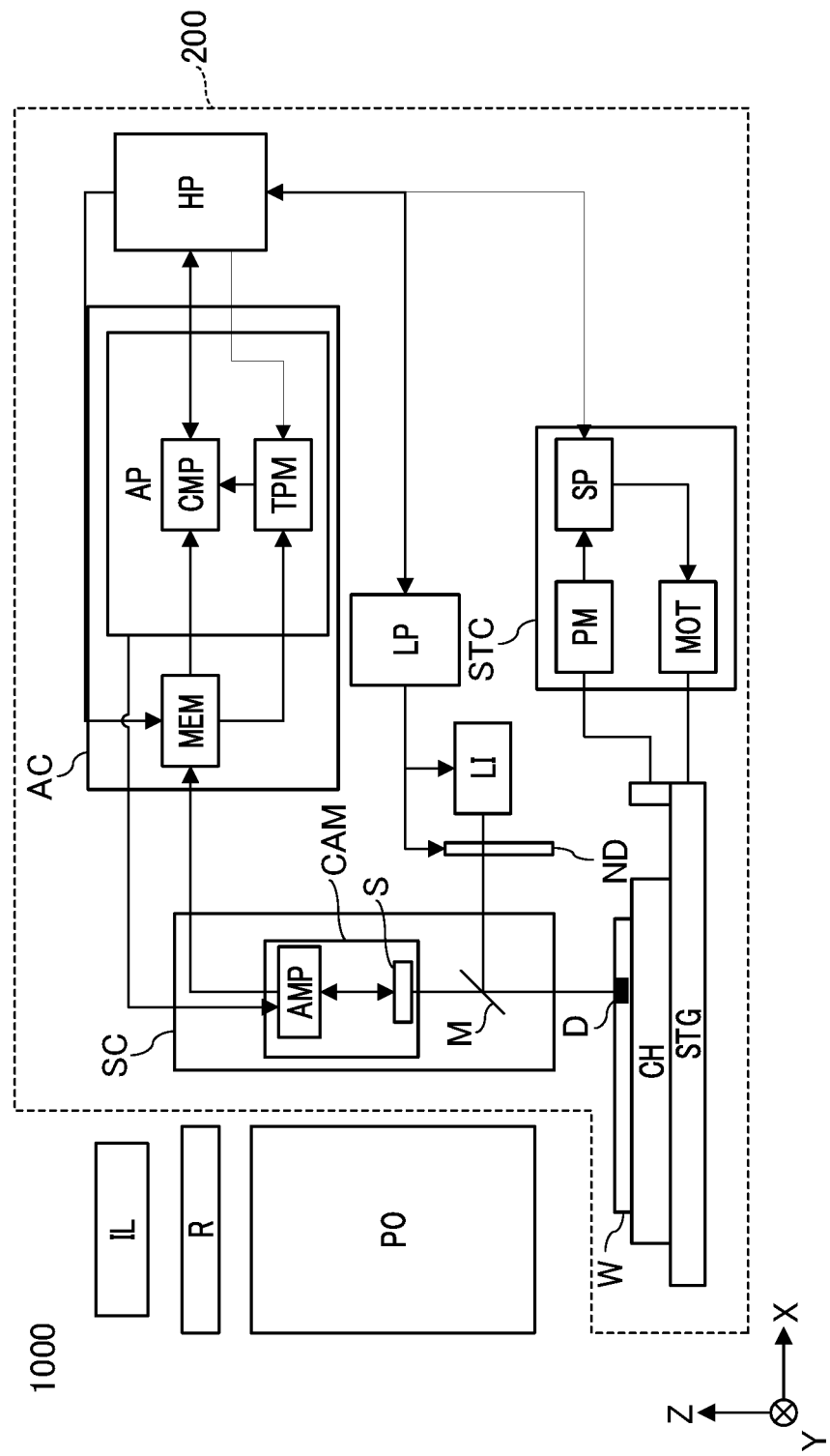
FIG. 10 is a schematic diagram that illustrates a configuration of an exposure apparatus to which an alignment apparatus according to a fourth embodiment is applied.

FIG. 10 is a schematic diagram that illustrates a configuration of an exposure apparatus 1000 to which an alignment apparatus 400 according to the fourth embodiment is applied. The present figure shows a connection diagram between the measurement unit AC and the host controller HP in the present embodiment. Except for the connection between the measurement unit AC and the host controller HP, the present figure is the same as FIG. 1. In the present embodiment, a template created in another process is externally input in the host controller HP in advance using a network or a portable memory. In correspondence to the process of the processing substrate, the template stored in the host controller HP is loaded onto a template storage area TPM in the measurement unit AC, and the template storage area TPM stores the template. That is, here, the template storage area TPM can be said to be a storage unit. Alternatively, an externally input target may be a device image as a template, which may be loaded onto the memory MEM and a template may be created from the image loaded in the processing of FIG. 2A (S105) and thereafter. Subsequent processing is the same as the flow shown in the first to third embodiments.

According to the above, since there is no need to create a template in the alignment apparatus, treatment by the alignment apparatus can be simplified.

Fifth Embodiment

Figure 11:
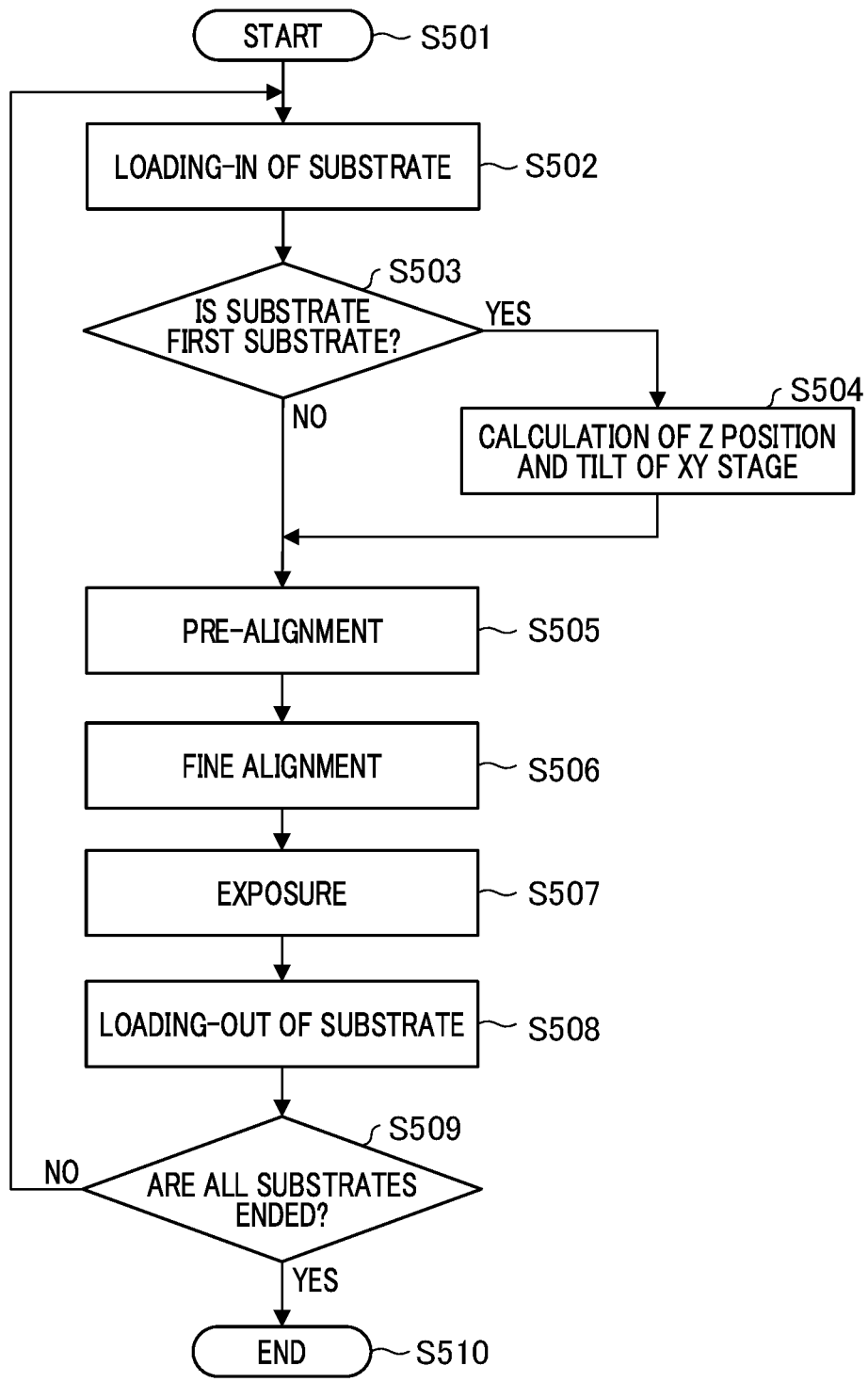
FIG. 11 is a flowchart of exposure processing according to a fifth embodiment.

An exposure apparatus according to a fifth embodiment of the present invention will be described with reference to the flow of FIG. 11. FIG. 11 is a flowchart of exposure processing according to a fifth embodiment. Each act (step) illustrated in this flowchart can be executed by control of each unit by the host controller HP. As an example of a sequence of the exposure apparatus, in the present embodiment, a plurality of substrates manufactured by the same process, for example, 25 substrates per lot are produced. When the sequence is started (S501), first, the substrate W is loaded onto the substrate stage by a loading device (not shown) (S502). Here, it is assumed that the template for pattern matching is created, stored in the measurement unit AC in advance by the method described in the first embodiment or the fourth embodiment, or transferred from the host controller HP. First, the host controller HP determines whether or not the substrate W loaded onto the substrate stage STG is a first substrate (S503). If the substrate W is a first substrate (YES), using any of the above-described embodiments, the Z position of the substrate stage, the tilt thereof, or both of them at which the correlation degree between the device pattern shape of the substrate and the template is higher are calculated by pattern matching (S504).

Next, pre-alignment, in which the calculated Z position of the substrate stage, the calculated tilt thereof, or both of them are adjusted, is executed (S505). Thereafter, based on the pre-alignment result, the substrate W is moved to the fine alignment position, and the fine alignment is executed (S506). Thereafter, the substrate is exposed (S507).

After the exposure is completed, the substrate is unloaded by the substrate stage STG (S508), and the host controller HP determines whether or not the exposure processing has been ended for all substrates (S509). If the exposure processing has not been ended for all substrates (NO), the process proceeds to the exposure processing for the next substrate. That is, the processing of S502 to S509 are performed on the next substrate, and this processing is repeated until the exposure processing is ended for all substrates.

For the second and subsequent substrates, preferably, the Z position of the substrate stage, the tilt thereof, or both of them which are calculated for the first substrate are stored in, for example, the measurement unit AC or the host controller HP, and the subsequent alignment processing is performed at this position. This is advantageous in terms of throughput. When the exposure processing is ended for all substrates (S509, YES), the exposure processing is ended (S510).

According to the above, even if the shape of the alignment mark, device, or the like formed on the substrate varies for each substrate, it is possible to perform accurate alignment and to improve alignment accuracy between the reticle and the substrate in the exposure apparatus.

Embodiment of Method of Manufacturing Article

A method of manufacturing an article according to the embodiment of the present invention is suitable for manufacturing an article such as a micro-device such as a semiconductor device or an element having a fine structure. The method of manufacturing an article according to the present embodiment includes a process of forming a pattern (a latent image) on a substrate (a photosensitive agent applied to the substrate) using the above-described exposure apparatus (a process of exposing the substrate), and a process of developing the substrate exposed (patterned) in such a process. Further, such a manufacturing method may include other well-known processing processes (oxidation, film formation, vapor deposition, doping, planarization, etching, resist peeling, dicing, bonding, packaging, and the like). The method of manufacturing an article according to the present embodiment is advantageous in at least one of the performance, quality, productivity, and production cost of the article as compared with the method of the related art.

Other Embodiments

The embodiments of the present invention have been described above, but the present invention is not limited to these embodiments, and various changes can be made within the scope of the gist.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-106854, filed Jun. 7, 2019, which is hereby incorporated by reference wherein in its entirety.

What is claimed is:

1. An alignment apparatus configured to perform alignment of an object in a first direction along a surface of the object, based on a position of a predetermined target formed on the object, the apparatus comprising:
   a holding unit configured to hold the object to be moved;
   an acquisition unit configured to acquire images of the predetermined target formed on the surface of the object held by the holding unit; and
   a controller configured to detect a position of the predetermined target in the first direction based on a correlation degree between the images acquired by the acquisition unit and a template,
   wherein the controller is configured to determine a relative distance between the object and the acquisition unit in a second direction perpendicular to the surface of the object, a relative tilt between the object and the acquisition unit, or the distance and the tilt based on the correlation degree, and
   wherein the controller is configured to detect the position of the predetermined target in the first direction based on the images acquired by the acquisition unit in a condition where the holding unit is controlled based on the distance, the tilt, or the distance and the tilt.

2. The alignment apparatus according to claim 1, wherein the controller is configured to determine the distance, the tilt, or the distance and the tilt while repeatedly changing the distance, the tilt, or the distance and the tilt to increase the correlation degree.

3. The alignment apparatus according to claim 2, wherein the controller is configured to compare the correlation degree with a predetermined threshold, and, in a case where the correlation degree is higher than the threshold, to determine the distance, the tilt, or the distance and the tilt.

4. The alignment apparatus according to claim 2, wherein the controller is configured to determine the distance, the tilt, or the distance and the tilt in a case where the distance, the tilt, or the distance and the tilt are repeatedly changed a predetermined number of times.

5. The alignment apparatus according to claim 1, wherein the predetermined target includes a three-dimensional structure.

6. The alignment apparatus according to claim 5, wherein the three-dimensional structure includes at least one of a through-hole, an alignment mark having a three-dimensional shape, a convex portion, and a concave portion.

7. The alignment apparatus according to claim 1, wherein the object is a substrate, and the first direction is a direction along a surface of the substrate held by the holding unit.

8. The alignment apparatus according to claim 7, wherein the second direction is a direction perpendicular to the surface of the substrate held by the holding unit.

9. The alignment apparatus according to claim 1, wherein the controller is configured to store the determined distance, the determined tilt, or the determined distance and tilt in a storage unit, and to drive the holding unit using the stored distance, the stored tilt, or the stored distance and tilt.

10. The alignment apparatus according to claim 1,
wherein the acquisition unit is configured to acquire a reference image that is an image of a shape of the predetermined target as a reference, and
wherein the controller is configured to extract feature points of the predetermined target from the reference image to generate the template.

11. The alignment apparatus according to claim 1,
wherein the controller is configured to adjust a position of the object using the template stored in a storage unit in advance.

12. An alignment method of performing alignment of an object in a first direction along a surface of the object, based on a position of a predetermined target formed on the object, the method comprising:
a holding step of holding the object to be moved;
an acquiring step of acquiring images of the predetermined target formed on the surface of the held object;
a determining step of determining a relative distance between the object and an acquisition unit that acquires the images in a second direction perpendicular to the surface of the object, a relative tilt between the object and the acquisition unit, or the distance and the tilt based on a correlation degree between the images acquired by the acquisition unit and a template; and
a detecting step of detecting a position of the predetermined target in the first direction based on the images acquired by the acquisition unit in a condition where a holding unit that holds the object is controlled based on the distance, the tilt, or the distance and the tilt.

13. A lithography apparatus that forms a pattern on a substrate using an original plate, comprising:
an alignment apparatus configured to perform alignment of the substrate in a first direction along a surface of the substrate, based on a position of a predetermined target formed on the surface, the alignment apparatus comprising:
a holding unit configured to hold the substrate to be moved;
an acquisition unit configured to acquire images of the predetermined target formed on the surface of the substrate held by the holding unit;
a controller configured to detect a position of the predetermined target in the first direction based on a correlation degree between the images acquired by the acquisition unit and a template,
wherein the controller is configured to determine a relative distance between the substrate and the acquisition unit in a second direction perpendicular to the surface of the substrate, a relative tilt between the substrate and the acquisition unit, or the distance and the tilt based on the correlation degree, and
wherein the controller is configured to detect the position of the predetermined target in the first direction based on the images acquired by the acquisition unit in a condition where the holding unit is controlled based on the distance, the tilt, or the distance and the tilt; and
a pattern forming unit configured to form the pattern on the substrate aligned by the alignment apparatus.

14. A method of manufacturing an article, comprising:
forming a pattern on a substrate using a lithography apparatus that forms the pattern on the substrate aligned in a first direction along a surface of the substrate, based on a position of a predetermined target formed on the surface; and
processing the substrate on which the pattern is formed in the forming,
wherein the article is manufactured from the processed substrate, and
wherein the lithography apparatus includes an alignment apparatus configured to perform alignment of the substrate in the first direction along the surface of the substrate, based on the position of the predetermined target formed on the substrate, the alignment apparatus comprising:
a holding unit configured to hold the substrate to be moved,
an acquisition unit configured to acquire images of the predetermined target formed on the surface of the substrate held by the holding unit, and
a controller configured to detect a position of the predetermined target in the first direction based on a correlation degree between the images acquired by the acquisition unit and a template,
wherein the controller is configured to determine a relative distance between the substrate and the acquisition unit in a second direction perpendicular to the surface of the substrate, a relative tilt between the substrate and the acquisition unit, or the distance and the tilt based on the correlation degree, and
wherein the controller is configured to detect the position of the predetermined target in the first direction based on the images acquired by the acquisition unit in a condition where the holding unit is controlled based on the distance, the tilt, or the distance and the tilt.

\* \* \* \* \*